(12) United States Patent
Brown et al.

(10) Patent No.: US 10,074,521 B2
(45) Date of Patent: Sep. 11, 2018

(54) REPLACEABLE UPPER CHAMBER PARTS OF PLASMA PROCESSING APPARATUS

(71) Applicant: Lam Research Corporation, Fremont, CA (US)

(72) Inventors: Daniel Arthur Brown, Brentwood, CA (US); Jeffrey A. Bogart, Campbell, CA (US); Ian J. Kenworthy, Mountain View, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 470 days.

(21) Appl. No.: 14/730,771

(22) Filed: Jun. 4, 2015

(65) Prior Publication Data

US 2015/0279621 A1 Oct. 1, 2015

Related U.S. Application Data

(62) Division of application No. 12/879,351, filed on Sep. 10, 2010, now Pat. No. 9,076,634.

(Continued)

(51) Int. Cl.
*H01J 37/32* (2006.01)
*C23C 16/455* (2006.01)

(52) U.S. Cl.
CPC .... *H01J 37/3244* (2013.01); *C23C 16/45563* (2013.01); *C23C 16/45578* (2013.01); *H01J 37/321* (2013.01); *H01J 37/32119* (2013.01); *H01J 37/32449* (2013.01); *H01J 37/32458* (2013.01); *H01J 37/32513* (2013.01);
(Continued)

(58) Field of Classification Search
CPC ............. H01J 37/3244; H01J 37/32513; H01J 37/32119; H01J 37/32522; H01J 37/32458; H01J 37/32449; H01J 37/321; H01J 37/32477; H01J 37/32495; C23C 16/45563; C23C 16/45578; C23C 16/4558

See application file for complete search history.

(56) References Cited

U.S. PATENT DOCUMENTS 5,095,189 A 3/1992 Frind et al.
5,480,678 A 1/1996 Rudolph et al.
(Continued)

FOREIGN PATENT DOCUMENTS

JP 10223397 A 8/1998
KR 10-0917118 4/2007
(Continued)

OTHER PUBLICATIONS

Search and Examination Report dated Dec. 14, 2011 in corresponding Singapore Application No. 201100619.4.
(Continued)

*Primary Examiner* — Jeffrie Robert Lund

(57) ABSTRACT

An upper chamber section of a plasma reaction chamber includes a ceramic window with blind bores in an upper surface for receipt of a thermal couple and a resistance temperature detector, a top chamber interface which comprises an upper surface which vacuum seals against the bottom of the window and a gas injection system comprising 8 side injectors mounted in the sidewall of the top chamber interface and a gas delivery system comprising tubing which provides symmetric gas flow to the 8 injectors from a single gas feed connection.

20 Claims, 14 Drawing Sheets

Related U.S. Application Data

(60) Provisional application No. 61/241,321, filed on Sep. 10, 2009.

(52) U.S. Cl.
CPC ... *H01J 37/32522* (2013.01); *H01J 37/32477* (2013.01); *H01J 37/32495* (2013.01)

(56) References Cited

U.S. PATENT DOCUMENTS

| | | | |
|---|---|---|---|
| 5,597,439 A | 1/1997 | Salzman | |
| 5,622,606 A | 4/1997 | Kugler et al. | |
| 5,772,771 A | 6/1998 | Li et al. | |
| 5,863,376 A | 1/1999 | Wicker et al. | |
| 5,882,411 A | 3/1999 | Zhao et al. | |
| 5,983,906 A | 11/1999 | Zhao et al. | |
| 5,992,453 A | 11/1999 | Zimmer | |
| 6,042,687 A * | 3/2000 | Singh | H01J 37/321 118/723 I |
| 6,074,953 A | 6/2000 | Donohoe et al. | |
| 6,095,083 A | 8/2000 | Rice et al. | |
| 6,113,732 A | 9/2000 | Yoshida et al. | |
| 6,132,553 A | 10/2000 | Ikeda et al. | |
| 6,174,377 B1 | 1/2001 | Doering et al. | |
| 6,178,918 B1 * | 1/2001 | van Os | C23C 16/4405 118/715 |
| 6,270,862 B1 * | 8/2001 | McMillin | C23C 16/455 427/569 |
| 6,298,784 B1 | 10/2001 | Knowlton et al. | |
| 6,308,654 B1 | 10/2001 | Schneider et al. | |
| 6,333,272 B1 | 12/2001 | McMillin et al. | |
| 6,450,117 B1 * | 9/2002 | Murugesh | C23C 16/4402 118/723 ER |
| 6,486,081 B1 * | 11/2002 | Ishikawa | C23C 16/401 438/787 |
| 6,508,913 B2 | 1/2003 | McMillin et al. | |
| 6,676,758 B2 | 1/2004 | Sillmon et al. | |
| 6,749,413 B2 | 6/2004 | Fare' | |
| 6,972,071 B1 | 12/2005 | Tyler | |
| 7,001,491 B2 | 2/2006 | Lombardi et al. | |
| 7,168,447 B2 | 1/2007 | Stadel et al. | |
| 7,220,497 B2 | 5/2007 | Chang | |
| 7,223,321 B1 | 5/2007 | Comendant et al. | |
| 7,311,782 B2 | 12/2007 | Strang et al. | |
| 7,371,332 B2 | 5/2008 | Larson et al. | |
| 7,712,434 B2 | 5/2010 | Dhindsa et al. | |
| 7,722,737 B2 | 5/2010 | Gondhalekar et al. | |
| 7,780,791 B2 | 8/2010 | Sharpless et al. | |
| 7,785,417 B2 | 8/2010 | Ni et al. | |
| 7,976,671 B2 | 7/2011 | Chandrachood et al. | |
| 8,236,133 B2 | 8/2012 | Katz et al. | |
| 8,236,134 B2 | 8/2012 | Kang | |
| 8,444,926 B2 | 5/2013 | Fodor et al. | |
| 8,512,509 B2 | 8/2013 | Bera et al. | |
| 2001/0010257 A1 | 8/2001 | Ni et al. | |
| 2002/0007795 A1 | 1/2002 | Bailey et al. | |
| 2003/0131794 A1 | 7/2003 | Rosenstein et al. | |
| 2003/0168008 A1 * | 9/2003 | Ohmi | H01J 37/32192 118/715 |
| 2004/0099378 A1 | 5/2004 | Kim et al. | |
| 2004/0112538 A1 | 6/2004 | Larson et al. | |
| 2004/0129673 A1 * | 7/2004 | Belyansky | C23C 8/36 216/67 |
| 2004/0149212 A1 | 8/2004 | Cho et al. | |
| 2005/0241583 A1 | 11/2005 | Buechel et al. | |
| 2006/0000413 A1 * | 1/2006 | Sharpless | H01J 37/321 118/723 I |
| 2006/0073078 A1 | 4/2006 | Peterman, Jr. | |
| 2006/0150913 A1 * | 7/2006 | Wang | H01J 37/321 118/723 IR |
| 2006/0196420 A1 * | 9/2006 | Ushakov | C23C 16/45563 118/715 |
| 2007/0029046 A1 * | 2/2007 | Li | C23C 16/4581 156/345.28 |
| 2007/0084408 A1 | 4/2007 | Yudovsky et al. | |
| 2007/0209781 A1 | 9/2007 | Hamman | |
| 2007/0281106 A1 * | 12/2007 | Lubomirsky | C23C 16/401 427/569 |
| 2008/0099431 A1 * | 5/2008 | Kumar | H01J 37/32422 216/44 |
| 2008/0102001 A1 * | 5/2008 | Chandrachood | H01J 37/32935 422/129 |
| 2008/0185284 A1 * | 8/2008 | Chen | H01J 37/321 204/164 |
| 2009/0183667 A1 | 7/2009 | Tian et al. | |
| 2010/0243164 A1 | 9/2010 | Sharpless et al. | |
| 2010/0330301 A1 * | 12/2010 | Yang | C23C 16/4405 427/578 |
| 2011/0006038 A1 * | 1/2011 | Kutney | H01J 37/3244 216/58 |
| 2011/0056626 A1 * | 3/2011 | Brown | H01J 37/321 156/345.33 |
| 2011/0079356 A1 * | 4/2011 | Kim | H01J 37/3244 156/345.33 |
| 2011/0186226 A1 * | 8/2011 | Sudou | C23C 16/4558 156/345.33 |
| 2011/0303362 A1 * | 12/2011 | Saito | H01J 37/321 156/345.33 |
| 2013/0019802 A1 * | 1/2013 | Leck | B05B 1/323 118/724 |
| 2013/0098554 A1 | 4/2013 | Chhatre et al. | |
| 2013/0102156 A1 | 4/2013 | Stevenson et al. | |
| 2013/0292055 A1 | 11/2013 | Setton et al. | |
| 2015/0235811 A1 * | 8/2015 | Cooperberg | H01J 37/32449 438/719 |
| 2016/0047040 A1 * | 2/2016 | Mishra | H01J 37/3244 216/67 |
| 2017/0114461 A1 * | 4/2017 | Takahashi | C23C 16/45544 |

FOREIGN PATENT DOCUMENTS

| | | |
|---|---|---|
| KR | 10-2008-0056428 | 6/2008 |
| KR | 10-2008-0073001 | 8/2008 |

OTHER PUBLICATIONS

International Search Report and Written Opinion dated Apr. 28, 2011 in corresponding PCT/US2010/002473.

* cited by examiner

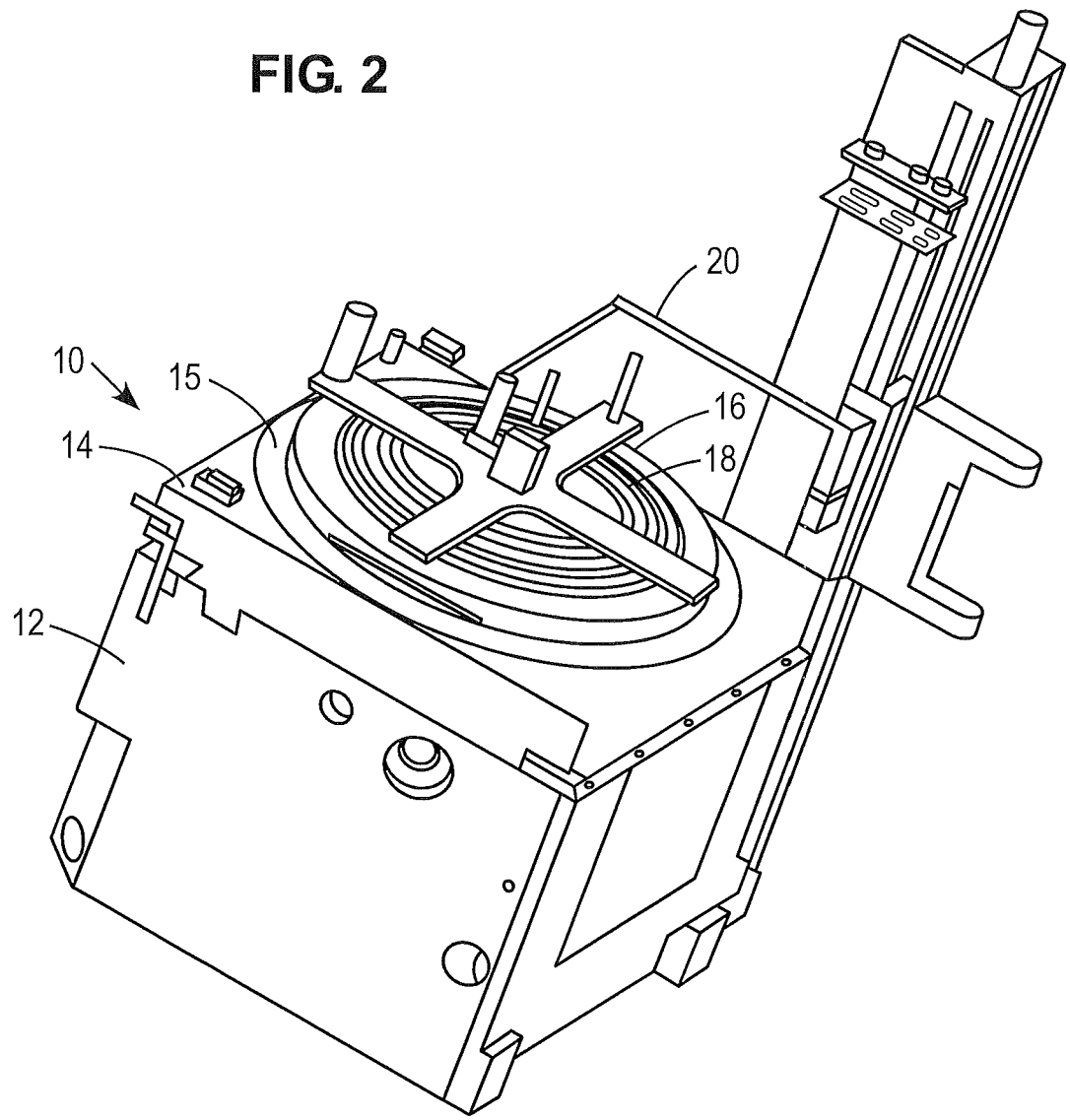

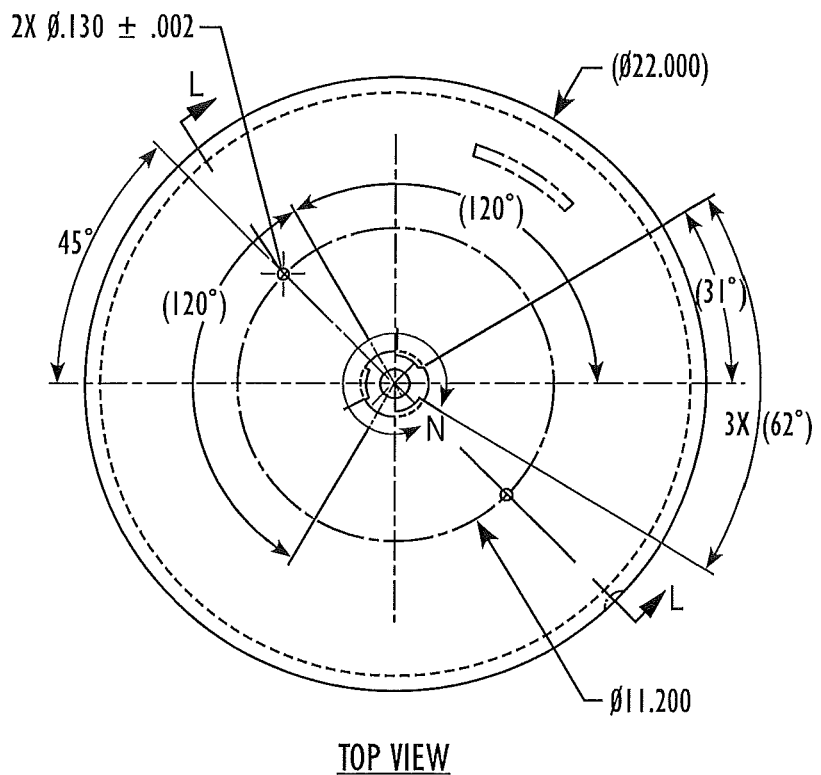
TOP VIEW
FIG. 4G
FIG. 4H
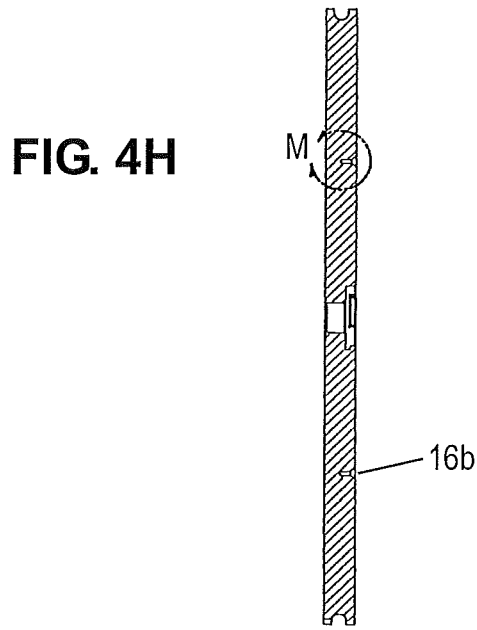

REPLACEABLE UPPER CHAMBER PARTS OF PLASMA PROCESSING APPARATUS

This application is a divisional of application Ser. No. 12/879,351, filed Sep. 10, 2010 entitled REPLACEABLE UPPER CHAMBER PARTS OF PLASMA PROCESSING APPARATUS which claims priority under 35 U.S.C. § 119(e) to U.S. Provisional Application No. 61/241,321, entitled REPLACEABLE UPPER CHAMBER PARTS OF PLASMA PROCESSING APPARATUS, filed Sep. 10, 2009, the entire content of each is hereby incorporated by reference.

FIELD OF THE INVENTION

The present invention relates in general to semiconductor substrate manufacturing technologies and in particular to a replacement parts of an upper chamber section of a plasma chamber.

BACKGROUND OF THE INVENTION

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Referring now to FIG. 1, a simplified diagram of inductively coupled plasma processing system components is shown. Generally, the plasma chamber (chamber) 202 is comprised of a bottom chamber section 250 forming a sidewall of the chamber, an upper chamber section 244 also forming a sidewall of the chamber, and a cover 252. An appropriate set of gases is flowed into chamber 202 from gas distribution system 222. These plasma processing gases may be subsequently ionized to form a plasma 220, in order to process (e.g., etch or deposition) exposed areas of substrate 224, such as a semiconductor substrate or a glass pane, positioned with edge ring 215 on an electrostatic chuck (chuck) 216. Gas distribution system 222 is commonly comprised of compressed gas cylinders (not shown) containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, etc.).

Induction coil 231 is separated from the plasma by a dielectric window 204 forming the upper wall of the chamber, and generally induces a time-varying electric current in the plasma processing gases to create plasma 220. The window both protects induction coil from plasma 220, and allows the generated RF field 208 to generate an inductive current 211 within the plasma processing chamber. Further coupled to induction coil 231 is matching network 232 that may be further coupled to RF generator 234. Matching network 232 attempts to match the impedance of RF generator 234, which typically operates at about 13.56 MHz and about 50 ohms, to that of the plasma 220. Additionally, a second RF energy source 238 may also be coupled through matching network 236 to the substrate 224 in order to create a bias with the plasma, and direct the plasma away from structures within the plasma processing system and toward the substrate. Gases and byproducts are removed from the chamber by a pump 220.

Generally, some type of cooling system 240 is coupled to chuck 216 in order to achieve thermal equilibrium once the plasma is ignited. The cooling system itself is usually comprised of a chiller that pumps a coolant through cavities within the chuck, and helium gas pumped between the chuck and the substrate. In addition to removing the generated heat, the helium gas also allows the cooling system to rapidly control heat dissipation. That is, increasing helium pressure increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In addition, a heating and cooling apparatus 246 may operate to control the temperature of the upper chamber section 244 of the plasma processing apparatus 202 such that the inner surface of the upper chamber section 244, which is exposed to the plasma during operation, is maintained at a controlled temperature. The heating and cooling apparatus 246 is formed by several different layers of material to provide both heating and cooling operations.

The upper chamber section itself is commonly constructed from plasma resistant materials that either will ground or are transparent to the generated RF field within the plasma processing system (e.g., coated or uncoated aluminum, ceramic, etc.).

For example, the upper chamber section can be a machined piece of aluminum which can be removed for cleaning or replacement thereof. The inner surface of the upper chamber section is preferably coated with a plasma resistant material such as a thermally sprayed yttria coating. Cleaning is problematic in that the ceramic coatings of this type are easily damaged and due to the sensitive processing of some plasma processes, it is sometimes preferred to replace the upper chamber section rather than remove it for cleaning.

In addition, correctly reseating the upper chamber section after maintenance is often difficult, since it must properly be aligned with the bottom chamber section such that a set of gaskets properly seal around the upper chamber section. A slight misalignment will preclude a proper mounting arrangement.

The volume of material in the upper chamber section also tends to add a substantial thermal mass to the plasma processing system. Thermal mass refers to materials have the capacity to store thermal energy for extended periods. In general, plasma processes tend to very sensitive to temperature variation. For example, a temperature variation outside the established process window can directly affect the etch rate or the deposition rate of polymeric films, such as poly-fluorocarbon, on the substrate surface. Temperature repeatability between substrates is often desired, since many plasma processing recipes may also require temperature variation to be on the order of a few tenths of degree C. Because of this, the upper chamber section is often heated or cooled in order to substantially maintain the plasma process within established parameters.

As the plasma is ignited, the substrate absorbs thermal energy, which is subsequently measured and then removed through the cooling system. Likewise, the upper chamber section can be thermally controlled. However, plasma processing may require temperature changes during multi-step processing and it may be necessary to heat the upper chamber section to temperatures above 100° C., e.g. 120, 130, 140, 150 or 160° C. or any temperature therebetween whereas the prior upper chamber sections were run at much lower temperatures on the order of 60° C. The higher temperatures can cause undesirable increases in temperature of adjacent components such as the bottom chamber section. For example, if it is desired to run the upper chamber section and overlying dielectric window at temperatures on the order of 130 to 150° C. and the bottom chamber section at ambient temperatures of about 30° C., heat from the much hotter upper chamber section can flow into the bottom chamber section and raise its temperature sufficiently to affect the plasma processing conditions seen by the semiconductor substrate. Thus, heat flow variations originating from the upper chamber section may cause the substrate temperature to vary outside narrow recipe parameters.

In view of the foregoing, replaceable upper chamber parts having desired features which cooperate to optimize plasma processing in a plasma processing system would be of interest.

SUMMARY OF THE INVENTION

In a preferred embodiment, a replaceable top chamber interface of an upper chamber section of a plasma reaction chamber in which semiconductor substrates can be processed, comprises a monolithic metal cylinder having a uniform diameter inner surface, an upper vacuum sealing surface extending horizontally away from the inner surface and a lower vacuum sealing surface extending horizontally away from the inner surface; the upper annular vacuum sealing surface adapted to seal against a dielectric window of the plasma chamber; the lower annular vacuum sealing surface adapted to seal against a bottom section of the plasma chamber; a thermal mass at an upper portion of the cylinder, the thermal mass defined by a wider portion of the cylinder between the inner surface and an outer surface extending vertically from the upper flange, the thermal mass being effective to provide azimuthal temperature uniformity of the inner surface, and a thermal choke at a lower portion of the cylinder effective to minimize transfer of heat across the lower vacuum sealing surface, the thermal choke defined by a thin metal section having a thickness of less than 0.25 inch and extending at least 25% of the length of the inner surface.

In another embodiment, a replaceable window of an upper chamber section of a plasma reaction chamber in which semiconductor substrates can be processed, comprises a ceramic disk having a uniform thickness, at least one blind hole configured to receive a temperature monitoring sensor, a vacuum sealing surface adapted to seal against an upper vacuum sealing surface of a top chamber interface, and a central bore configured to receive a top gas injector which delivers process gas into the center of the chamber.

In a further embodiment, a gas delivery system configured to supply gas to side injectors mounted in a sidewall of the top chamber interface comprises bifurcated gas lines which receive tuning gas from a common feed and gas tubes arranged to flow the tuning gas equal distances from the common feed to the injectors. The side injectors can include 8 injectors symmetrically arranged around the top chamber interface and the gas lines can include eight gas lines of which two primary gas lines of equal length extend from the common feed, two secondary gas lines of equal length extend from the outlets of the primary gas lines and four tertiary gas lines of equal length extend from outlets of the secondary gas lines. The primary gas lines are longer than the secondary gas lines and the secondary gas lines are longer than the tertiary gas lines. The primary gas lines are connected to midpoints of the secondary gas lines and the secondary gas lines are connected to midpoints of the tertiary gas lines. The gas delivery system is designed to fit within a small volume defined by an annular recess in the outer surface of the top chamber interface.

BRIEF DESCRIPTION OF THE DRAWING FIGURES

FIG. 2 shows a perspective view of an exemplary plasma chamber which can include a window, a top chamber interface and a side injector gas supply system as described herein.

FIGS. 3A-D show details of a top chamber interface as described herein.

FIGS. 4A-H show details of a ceramic window described herein.

FIGS. 5A-K show details of a side gas injection delivery system described herein.

Figure 6A:
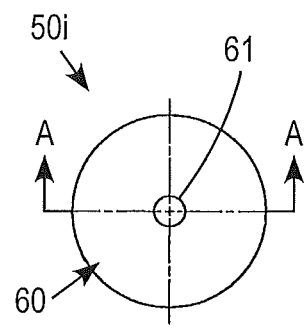
Figure 6B:
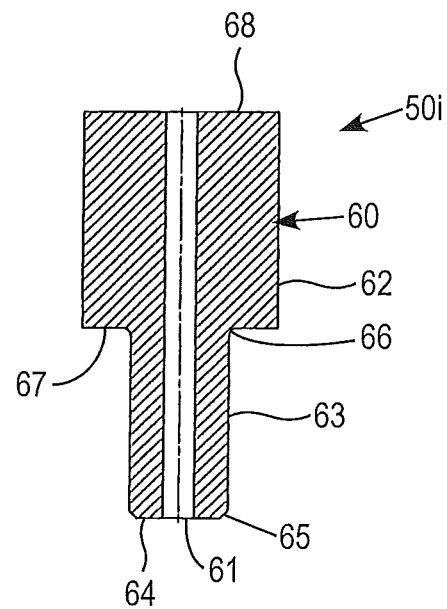

FIGS. 6A-B show details of a gas injector which mounts in an opening in the sidewall of the top chamber interface and is supplied gas by the side gas injection system.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. As used herein, the term "about" should be construed to include values up to 10% above or below the values recited.

Described herein are replaceable parts of an upper chamber section of a plasma chamber such as that illustrated in FIG. 2. The parts include a ceramic window, top chamber interface and side gas injection delivery system.

The plasma system shown in FIG. 2 includes a chamber 10 which includes a lower chamber 12 and an upper chamber 14. The upper chamber 14 includes a top chamber interface 15 which supports a dielectric window 16. An RF coil 18 overlies the window and supplies RF power for energizing process gas into a plasma state inside the chamber. A top gas injector is mounted in the center of the window for delivering process gas from gas supply line 20.

Figure 1:
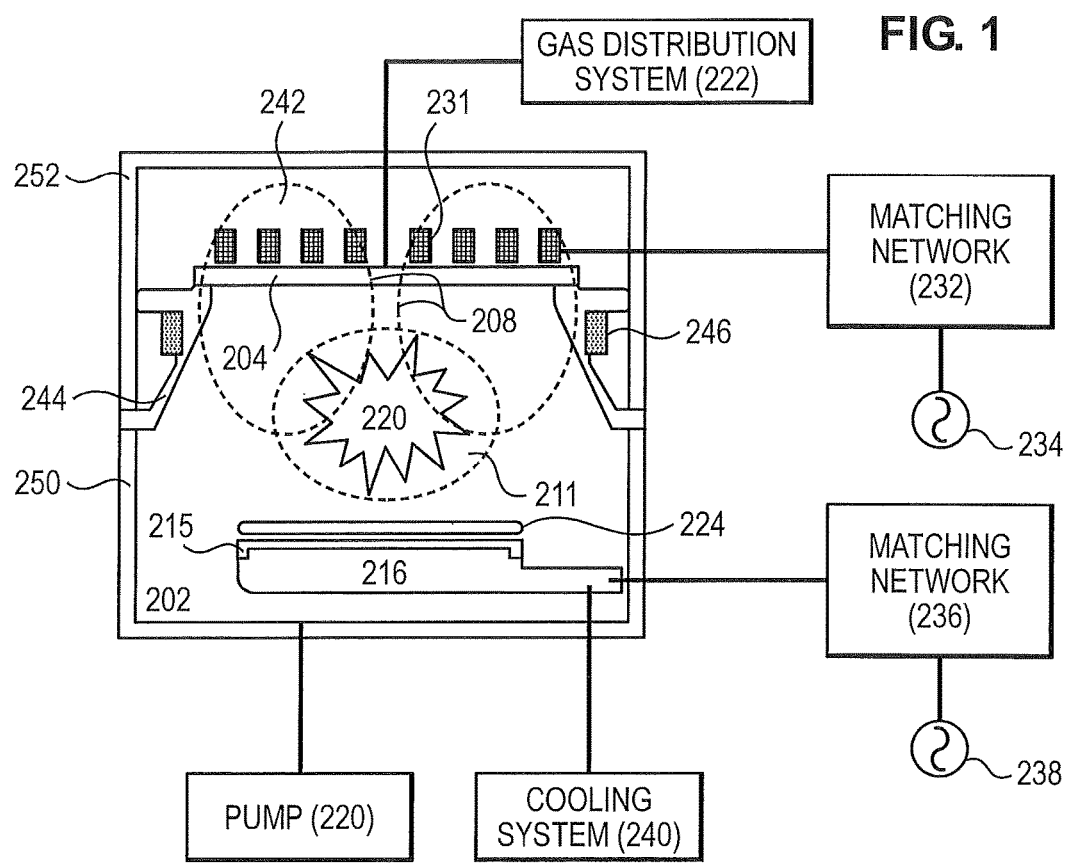
FIG. 1 shows a simplified diagram of a plasma processing system.
Figure 3A:
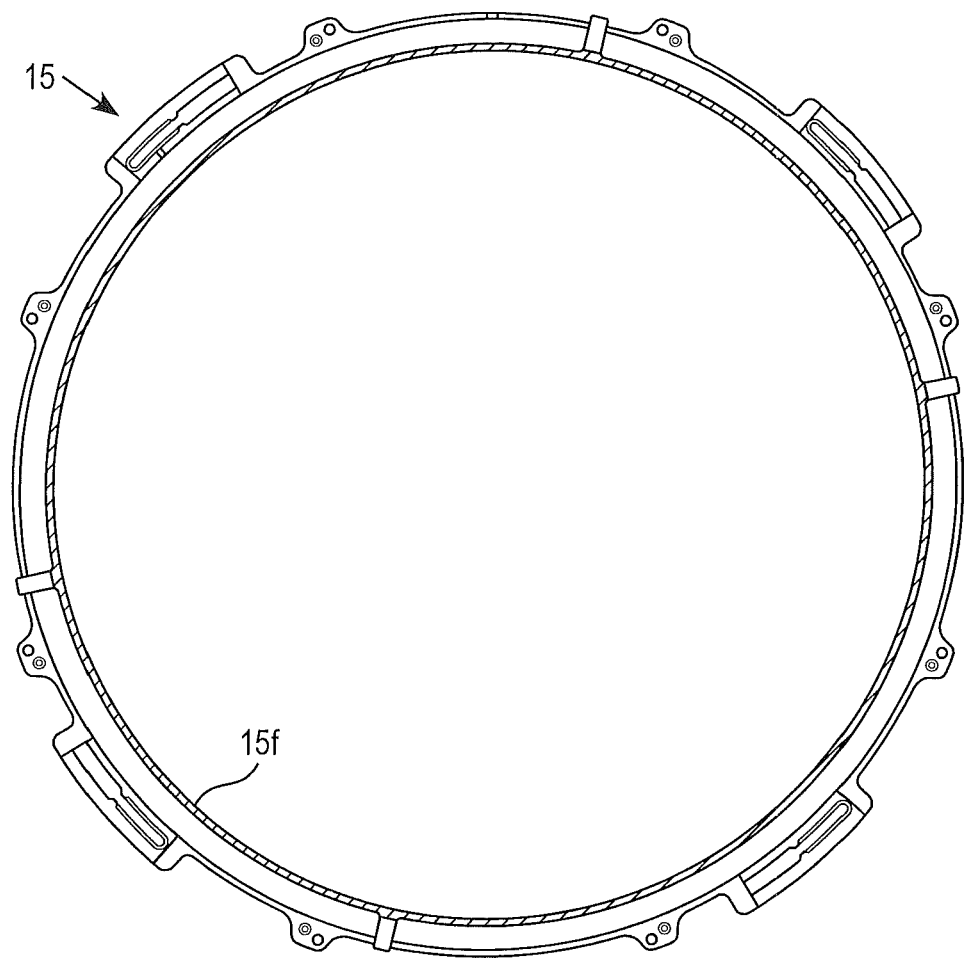
Figure 3B:
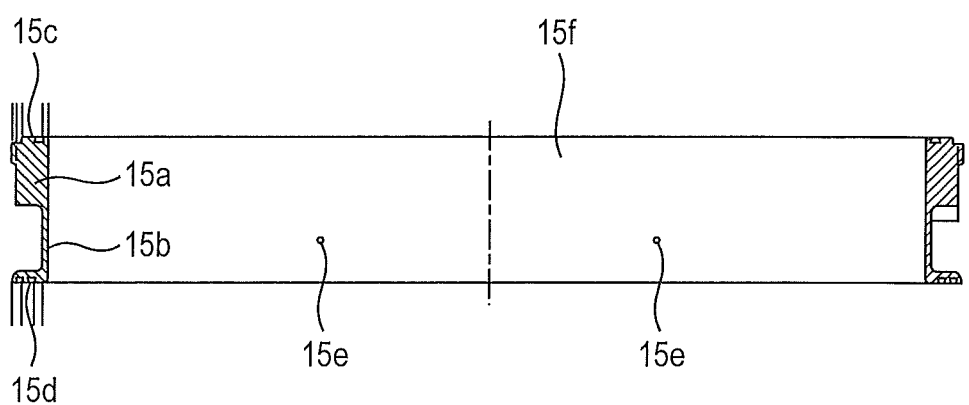
Figure 3C:
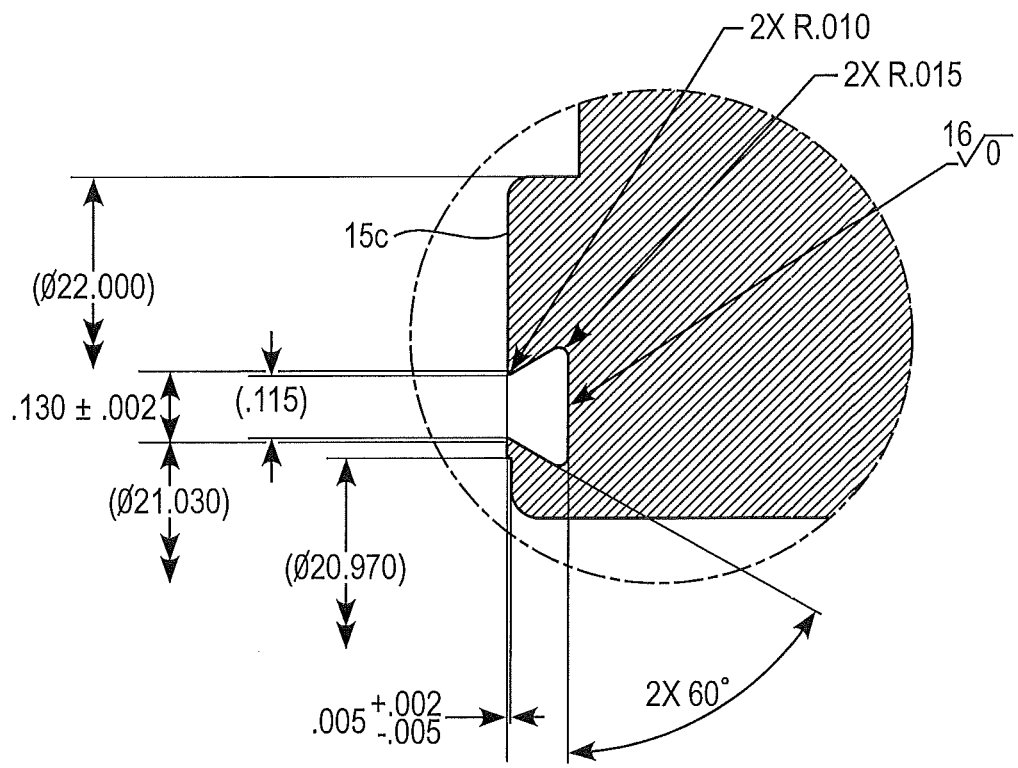
Figure 3D:
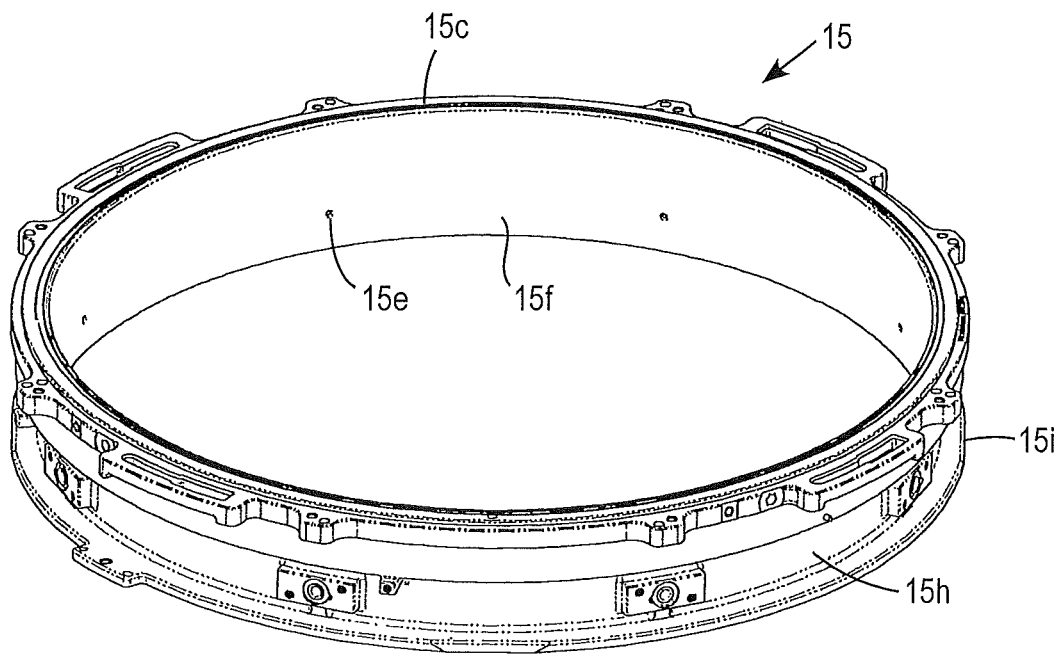

FIGS. 3A-D show details of the top chamber interface 15. FIG. 3A is a top view of the top chamber interface 15, FIG. 3B is a side cross sectional view illustrating a thickened wall section 15a, a thin walled section 15b, an upper vacuum sealing surface 15c, a lower vacuum sealing surface 15d and side injection ports 15e in side wall 15f. FIG. 3C shows details of the upper vacuum sealing surface 15c wherein various dimensions of the surface and of a groove 15g for receipt of an O-ring are set forth. FIG. 3D is a perspective view showing locations of the side gas injectors in an annular recess 15h in the outer wall 15i.

Figure 4A:
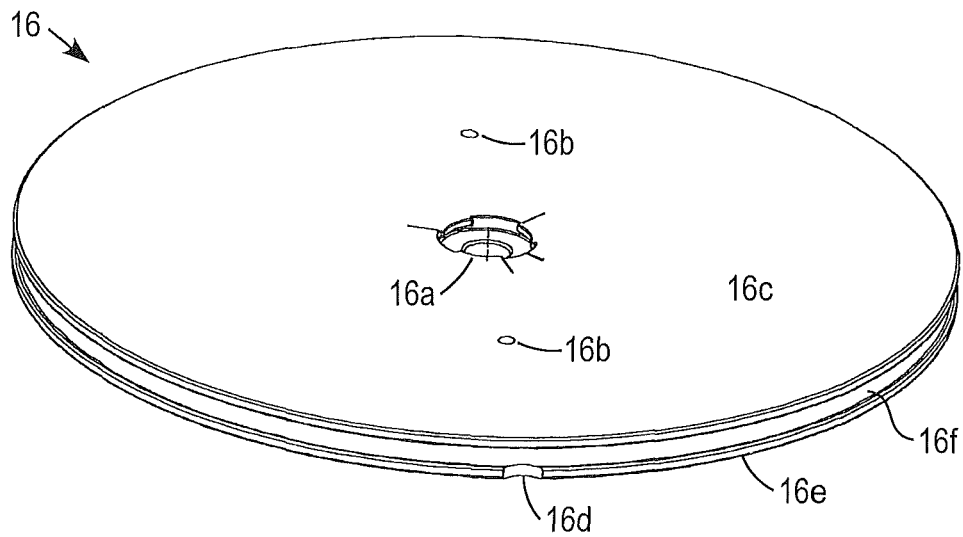
Figure 4B:
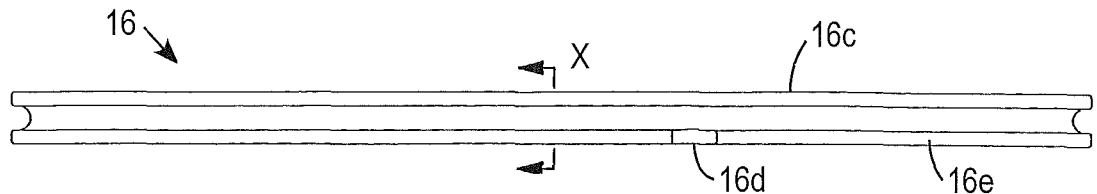
Figure 4C:
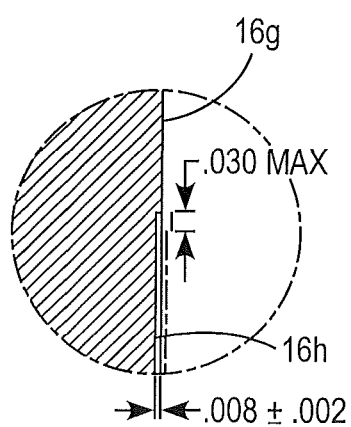
Figure 4D:
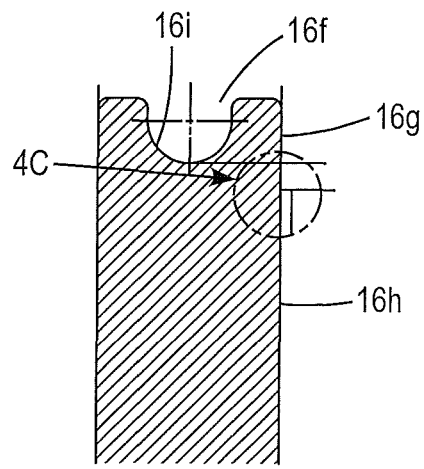
Figure 4E:
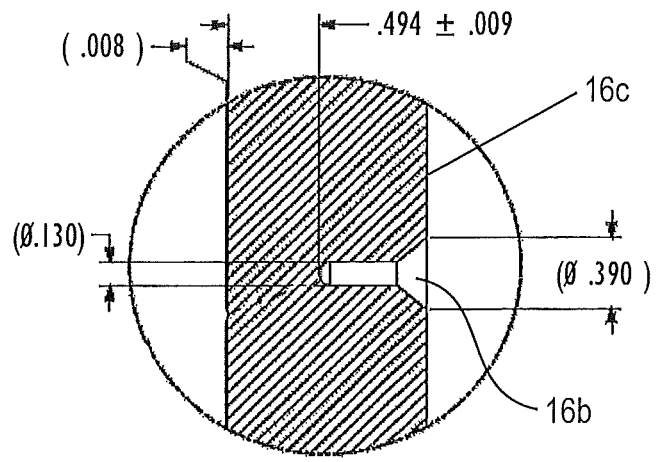
Figure 4F:
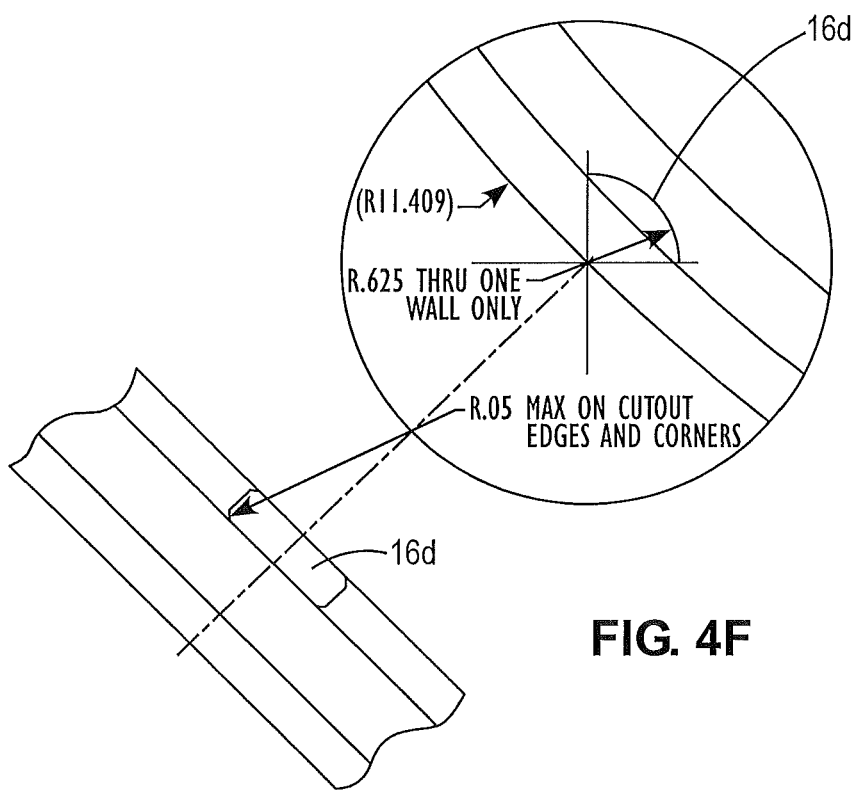

FIG. 4A shows details of the window 16 which includes a central opening 16a for receipt of a top injector, blind holes 16b in upper surface 16c for receipt of temperature sensors, and a clocking feature 16d in a bottom flange 16e of the outer side surface 16f. FIG. 4B is a side view of the window shown in FIG. 4A. FIG. 4C shows details of a vacuum sealing surface 16g which is outward of a recessed surface which is coated with a ceramic coating such as plasma sprayed yttrium oxide. FIG. 4D is a cross section of the outer periphery of the window wherein a rounded recess 16i extends into the sidewall 16f. FIG. 4 E shows details and dimensions of one of the blind bores 16b. FIG. 4F shows details and dimensions of the clocking feature 16d which is a recess having a radius of 0.625 inch extending into the side of the window at a single location and edges of the recess form an angle of 90° with the center of the radius. FIG. 4G shows details and dimensions of the window and FIG. 4H shows a cross section of the window illustrating the relative depths of the blind bores.

Figure 5A:
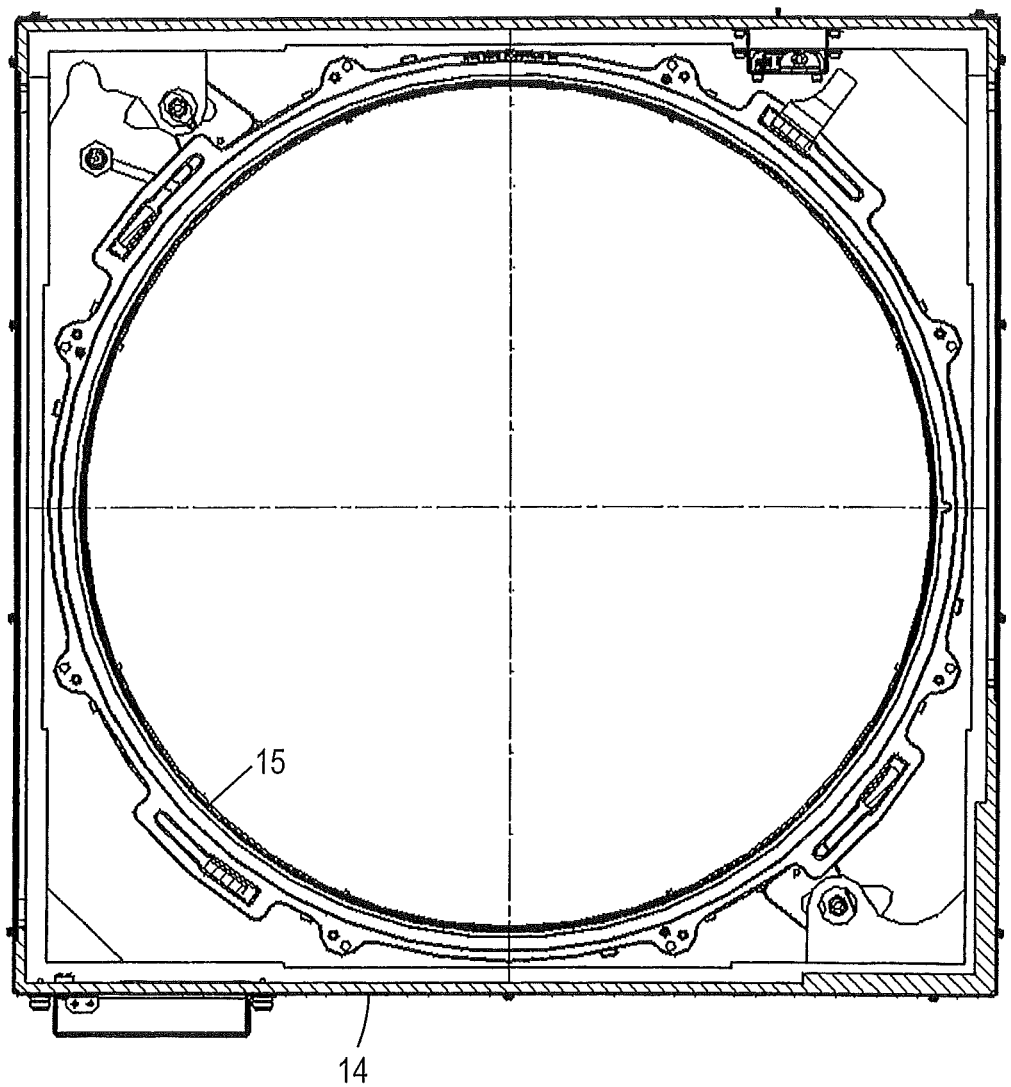
Figure 5B:
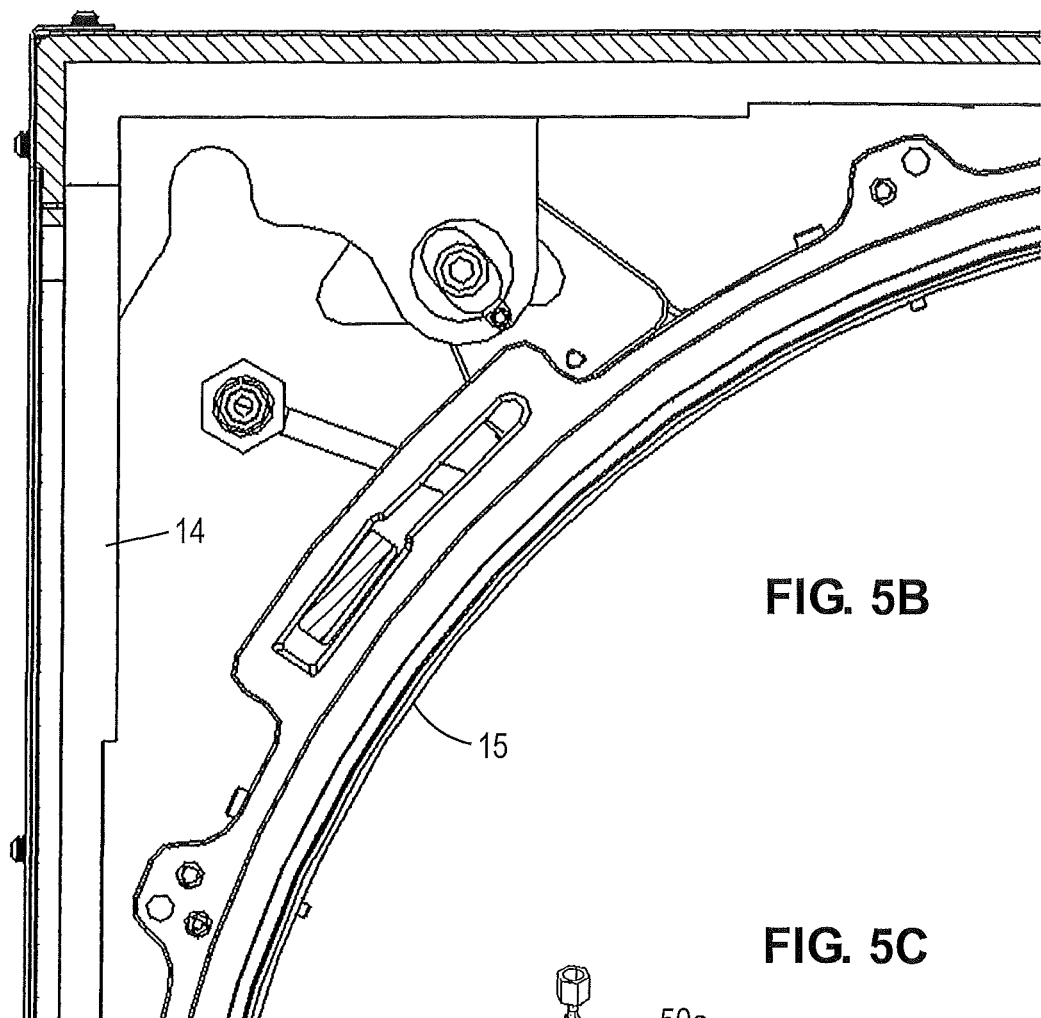
Figure 5C:
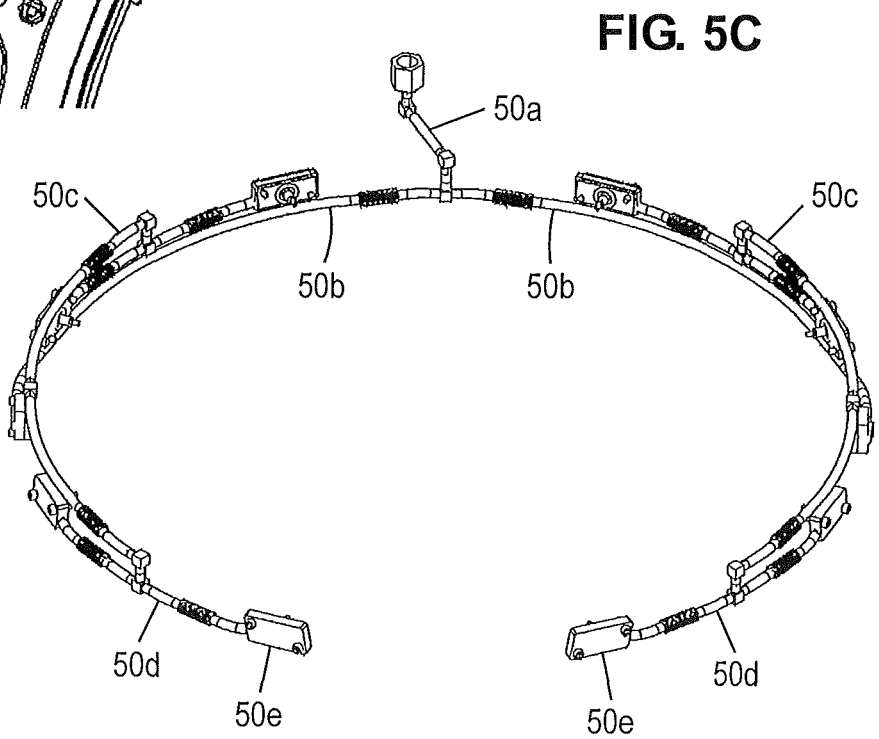
Figure 5D:
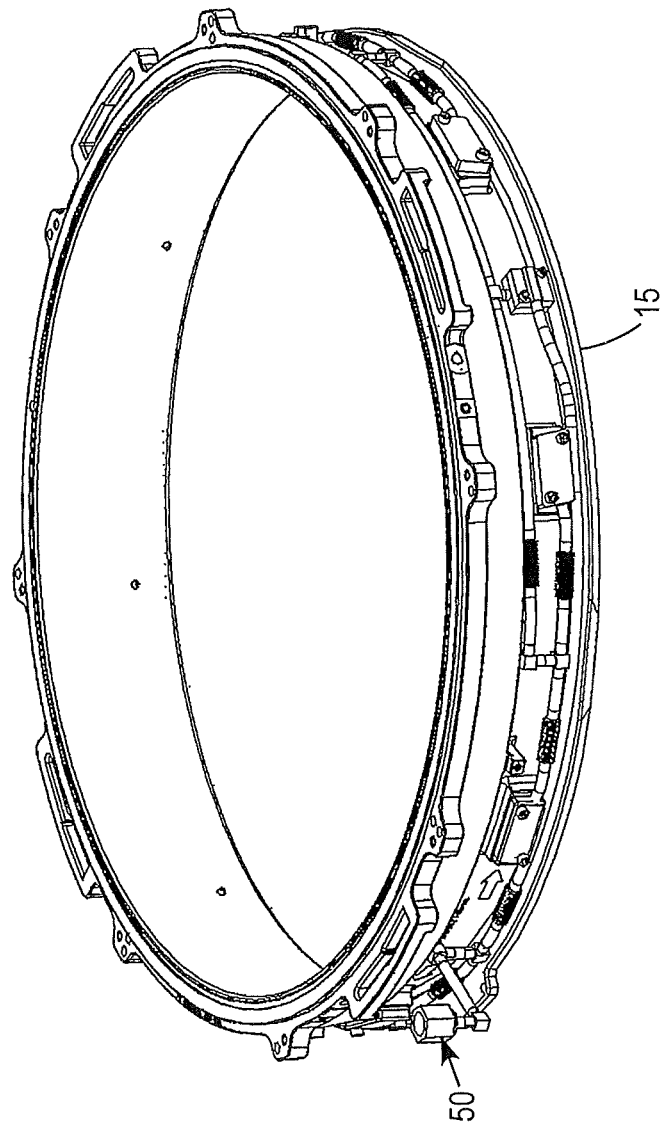
Figure 5E:
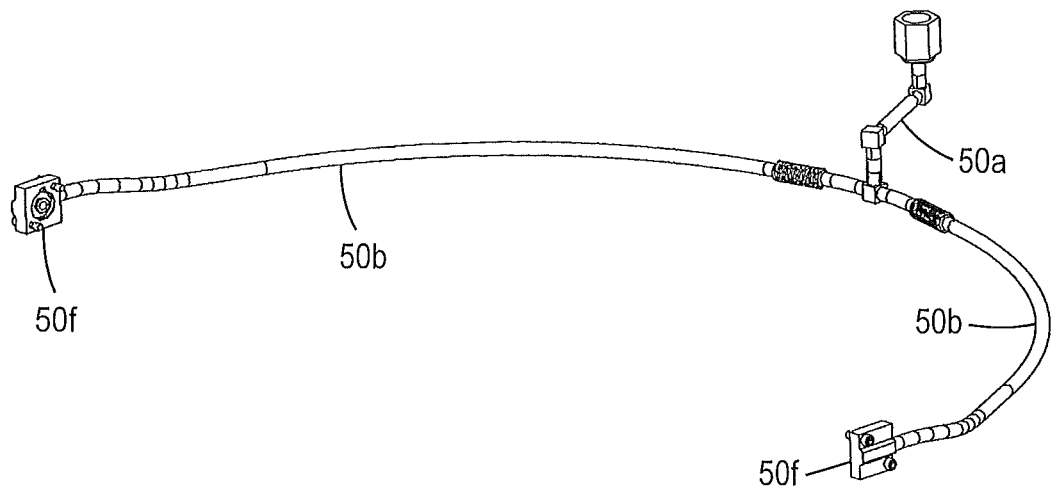
Figure 5F:
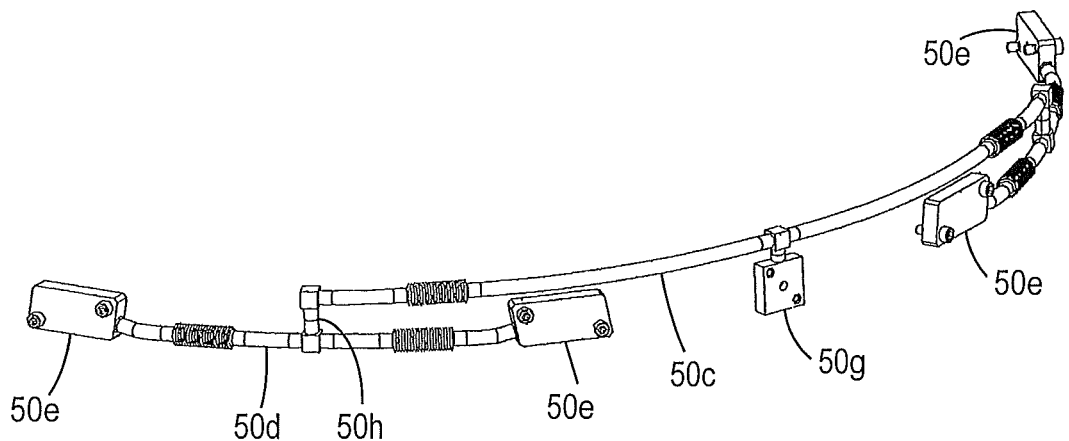
Figure 5G:
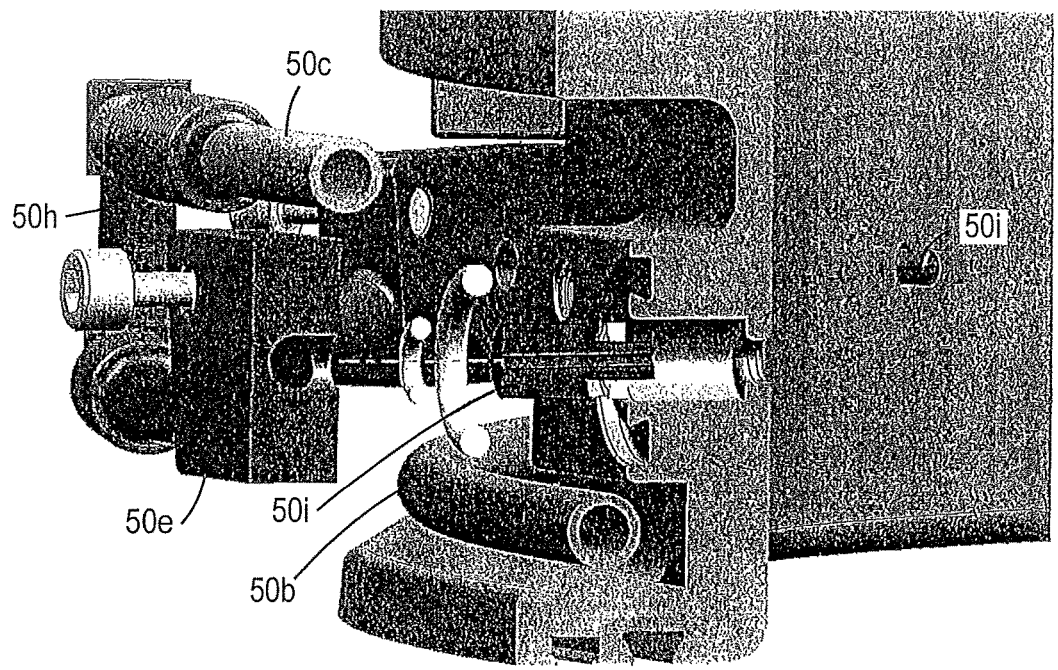
Figure 5H:
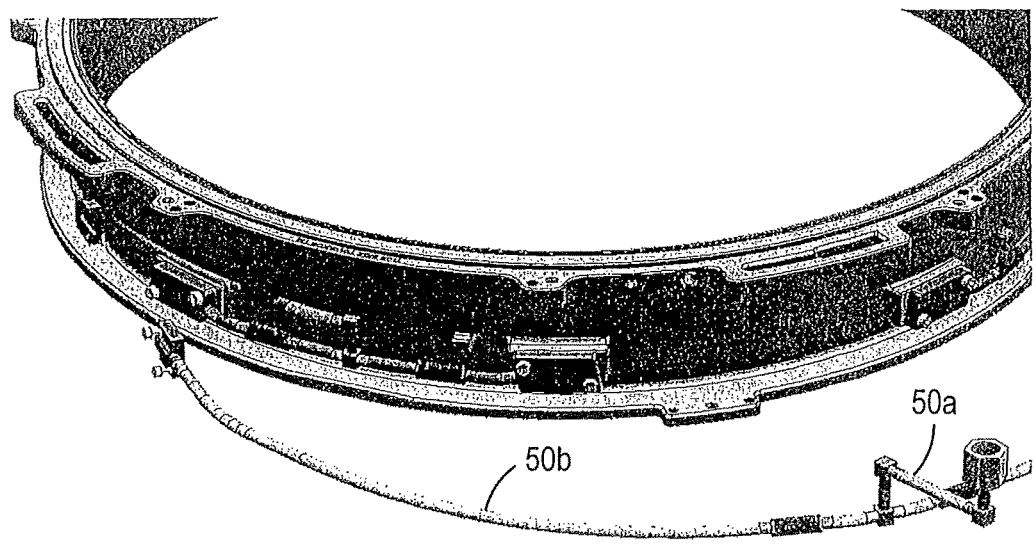
Figure 5I:
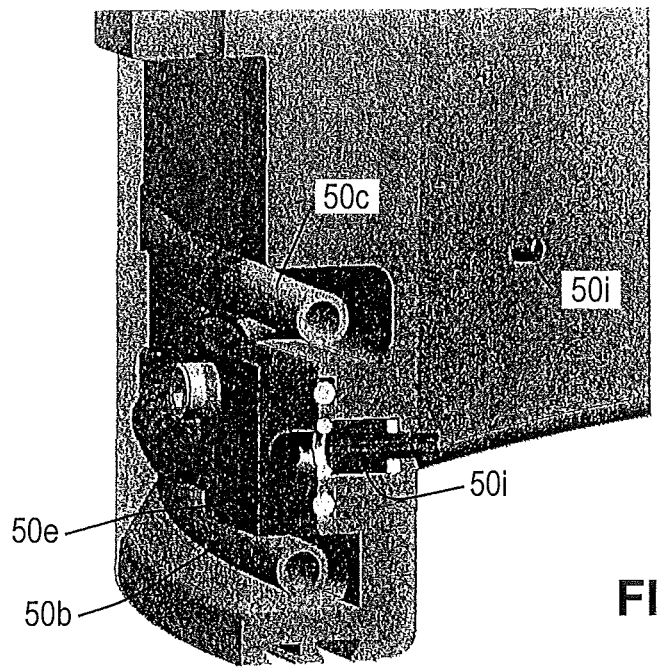
Figure 5J:
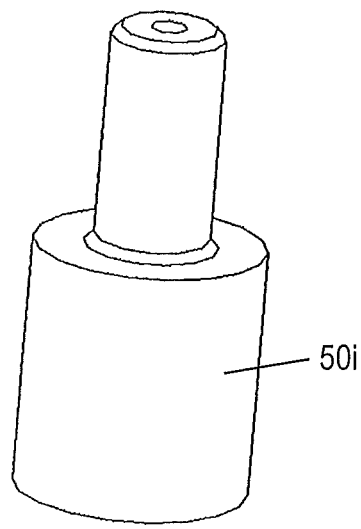
Figure 5K:
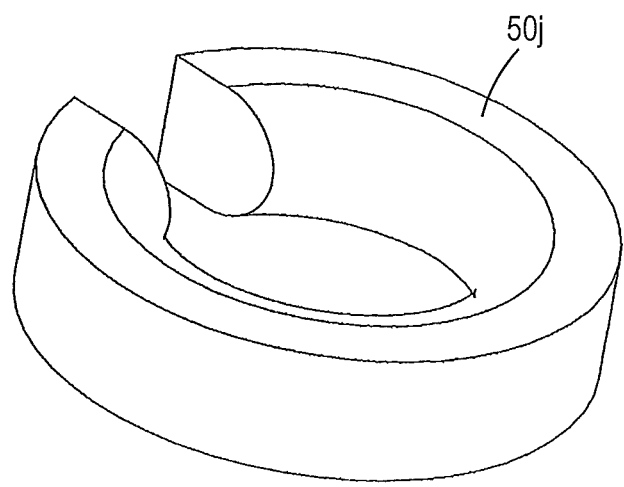

FIG. 5A shows a top view of the chamber wherein the cylindrical top chamber interface 15 is located within a square housing of the upper chamber 14. FIG. 5B is an enlargement of the upper left corner in FIG. 5A illustrating a bracket arrangement for supporting the top chamber interface. FIG. 5C illustrates a side injection gas supply system 50 which includes a common gas supply feed 50a, two equal length primary gas lines 50b, two equal length secondary gas lines 50c, four equal length tertiary gas lines 50d and eight connections 50e which deliver tuning gas to eight side injector locations. FIG. 5D shows how the gas injection system 50 (wherein tuning gas travels the same distance from the common feed 50a to each of the side injectors) fits within a small volume defined by the annular recess in the outer surface of the top chamber interface 15. FIG. 5E shows details of the common gas feed 50a and the two primary gas lines 50b which terminate in a connection 50f. FIG. 5F shows details of one of the secondary gas lines 50c bifurcated by gas connection 50g (which connects to gas connection 50f) and two tertiary gas lines 50d bifurcated by connections 50h which connect to ends of the secondary gas lines 50c. FIG. 5G shows details of a side gas injector 50i mounted in the sidewall of the top chamber interface 15. FIG. 5H shows details of how the primary gas line 50b fits within the annular recess in the sidewall of the top chamber interface 15. FIG. 5I shows details of how the gas injection system delivers gas to one of the side injectors 50i. FIG. 5J shows a side gas injector 50i and FIG. 5K shows a washer 50j which fits between a surface of a side gas injector 50i and an opposed surface in a side injection port 15e of the top chamber interface 15.

In a preferred embodiment, the top chamber interface is a hard anodized aluminum cylinder that has features for mounting process support hardware (RF input coil, temperature controlled window, alignment features, chamber temperature control hardware, side gas injectors, gas delivery tubing, etc.), sealing vacuum, and conducting electrical current out of the part. The vacuum seals are preferably one or more O-rings at the top and bottom of the cylinder. Electrical conduction is preferably established through the use of a metallic spring RF gasket that fits into a groove on the cylinder and contacts a bare metal strip on an adjacent component. The weight and thermal mass are increased at the upper portion of the cylinder to achieve the desired temperature uniformity. The internal plasma exposed surface can be coated with a ceramic material such as plasma sprayed yttrium oxide.

FIG. 6A shows an end view of the proximal end of one of the eight side gas injectors 50i and FIG. 6B shows a cross section of the injector 50i taken along lines A-A in FIG. 6A. The injector 50i includes an injector body 60 which has a central bore 61 of uniform diameter of 0.038 to 0.042 inch, preferably 0.040 inch extending axially through proximal and distal end surfaces of the injector body 60. The injector body 60 has a total length of 0.52 to 0.53, preferably 0.526 inch, an outer diameter of 0.2 to 0.3, preferably 0.25 inch at an upstream section 62 which extends 0.275 to 0.285, preferably 0.278 inch and an outer diameter of 0.12 to 0.13, preferably 0.125 inch at the downstream section 63 having a length of 0.245 to 0.250, preferably 0.248 inch. The central bore has an aspect ratio of at least 10, preferably 13 to 14. This aspect ratio of the bore can control back diffusion into the injector to prevent corrosion of the stainless steel gas feed lines. The distal end 64 of the downstream end 63 includes a 45° (±10°) chamfer forming a 0.005 to 0.015, preferably 0.01 inch wide annular surface 65. The corner 66 between the outer surface of downstream section 63 and surface 67 which is perpendicular to and extends between the outer surfaces of the upstream and downstream sections is rounded with a radius of 0.005 to 0.015, preferably 0.01 inch. The surface 67 bears against washer 50j as shown in FIG. 5K. The proximal end surface 68 of the upstream section 62 bears against another washer which surrounds an outlet of the connection 50e as shown in FIG. 5I. As can be seen in FIG. 5I, the distal end of the injector 50i projects beyond the side wall. Preferably the distal end of the injector 50i extends 0.05 to 0.2, more preferably about 0.1 inch into the chamber.

In accordance with a preferred embodiment, the window is a ceramic disk with a bore in the middle that interfaces with a ceramic gas injector. It also has a raised landing pad of about 0.008 inch which extends about 0.5 inch from the outer periphery on the bottom outer diameter (OD) that interfaces with the top chamber interface. There is an O-ring seal at the interface between the window and the top chamber interface. The ceramic disk is about 1 inch thick and is made from a low loss tangent high purity ceramic material such as alumina and is coated on the bottom recessed surface with yttrium oxide for plasma resistance. The disk has two blind bores on the top surface that accept a thermal couple (TC) and a Resistance Temperature Detector (RTD). The location and depth of the TC and RTD are selected to achieve desired process temperature monitoring and avoid damage to the window. The bottom of the TC and RTD holes have a spherical radius to reduce the stress concentration of the hole.

The contact area between the top chamber interface and the window determines the amount of heat transferred between these two components. During plasma processing, the middle of the window is hot, and it is desirable for the contact area to conduct heat into the edge of the window to help make the temperature of the OD close to that of the middle. At idle (when plasma is not generated in the chamber), the middle of the window is cold, and it is desirable for the contact area to not conduct any heat into the window and to match the temperature of the middle of the window.

The depth of the TC and RTD is established by determining where the neutral axis (zero stress line, it is the line that separates the tensile and compressive stresses) of the window is, and keeping the bottom of the hole above that axis. The analysis can also determine what the temperature difference is at the measured point, and the point of interest. This difference can be accounted for in software used to conduct the analysis.

The location of the TC and RTD is also analyzed to determine what offset needs to be accounted for in the software. The stress in the window can be correlated to the temperature difference between the middle and OD of the window. This analysis can correlate the temperature of the middle of the window and the temperature of the measured point since the temperature of the middle of the window cannot be measured due to the presence of the top gas injector.

If the bottom of the holes do not have the spherical radius, the window would have a high stress concentration where the holes are located. Because the inside of the window is subject to the vacuum pressure in the chamber, the window could fracture when there is a thermal gradient from the center to the edge of the window if the bottoms of the holes are not rounded. Adding a spherical radius at the bottom of the holes eliminates sharp edges and therefore reduces the stress and likelihood of fracture.

The ceramic window can be replaced, serviced, maintained and is easily manufacturable. The window is preferably about 1 inch thick and about 22 inches in diameter. The desired dimensions of the bores for the TC and RTD are 0.494±0.009 inch from the yttrium coated surface and the bores are 180° apart on a radius of about 5.6 inches from the center of the window. The bores have a total depth of about 0.5 inch and the entrances of the bores 16*b* are tapered at 45° with a diameter of 0.390 inch at the bore entrance. The bottoms of the bores have a diameter of about 0.130 inch.

The side injection system can deliver a tuning gas and the system is designed to be a removable, serviceable, maintainable, manufacturable, leak resistant, plasma resistant, symmetrically fed 8 port gas injection system. It can operate within a temperature range of 20° C.-120° C. and uses ¼ inch stainless steel tubing and custom designed, low-profile vacuum sealing interfaces. Nearly every surface in the side gas injection system fits within a space of rectangular cross section 0.750 inch wide by 1.612 inches tall and, simultaneously, nearly every surface does not extend outside a diameter of 22.5 inches.

The function of the side gas injection system is to provide tuning gas uniformly into the plasma. The flow rate and flow uniformity of the side gas injection system are primarily the functions of the inner bore diameter of the eight side gas injectors which are made of solid yttria, total volume of the gas delivery tubes, and symmetric path to all injector locations from the singular gas feed location. Dimensions of the gas injection system can be: inner bore diameter of each solid yttria injector: 0.040±0.002 inch, volume of gas injection system from VCR fitting (the gas fitting at the upstream end of common feed 50*a*): 2.922 in$^3$, gas travel path length to each injector from VCR fitting: 37.426 inches.

The vacuum fitting interfaces are smaller than, for example, a K1S fitting and the yttria side gas injector, which is the only piece of the system directly exposed to plasma, can be minimized in size and replaced when consumed without having to replace the much more expensive stainless steel weldments.

The top chamber interface is an anodized and ceramic-coated aluminum cylinder with O-ring seals on top and bottom and a top contact surface mating with the ceramic window. The top chamber is actively heated and maintained at a constant temperature for repeatable wafer processing.

The temperature at the edge of the window is largely controlled by the interface to the top chamber. The chamber interface largely controls how much heat goes into or is removed from the edge of the window. Thus in order to keep the edge cool during idle and hot during wafer processing it is desirable to keep temperature gradients small during idle or processing so that an optimum heat flow across the interface is provided. Too much heat flow during idle will cause the edge to get too hot and fracture the window. Too little heat flow during wafer processing will cause the edge to be too cold, and lead to fracture. The feature of the interface which largely controls the heat flow across the interface is the contact surface area of the chamber to the window in air. The in-air contact region is from the outer diameter of the O-ring groove to the outer diameter of the chamber where the window contacts the chamber. These dimensions can be optimized by analysis and testing for the heat flow during idle and during wafer processing.

In addition, the flatness of the interface is critical to the heat transfer and must be maintained. Various desired dimensions include outer O-ring groove diameter Ø1=21.290±0.007 inch, chamber contact region outer diameter Ø2=22.00±0.005 inch, chamber contact region flatness 0.002 inch.

Having disclosed exemplary embodiments and the best mode, modifications and variations may be made to the disclosed embodiments while remaining within the subject and spirit of the invention as defined by the following claims.

What is claimed is:

1. A ceramic side gas injector configured to mount in any one of eight symmetrically arranged gas injector mounting holes in a side wall of a top chamber interface of a plasma reaction chamber in which semiconductor substrates can be processed, the ceramic side gas injector consisting of:
   a first cylindrical section having:
      a first diameter;
      a first end; and
      a first axial end surface; and
   a second cylindrical section having:
      a second diameter that is less than the first diameter,
      a second end where the second cylindrical section joins the first end of the first cylindrical section; and
      a second axial end surface; and
   a uniform diameter central bore extending in an axial direction through the first and second axial end surfaces.

2. The gas injector of claim 1, wherein the central bore has a diameter of 0.038 to 0.042 inch and length of 0.52 to 0.53 inch.

3. The gas injector of claim 1, wherein the first cylindrical section and the second cylindrical section consist entirely of yttria.

4. The gas injector of claim 1, wherein the first diameter of the first cylindrical section is sized to fit in a wider portion of the mounting hole, and the second diameter of the second cylindrical section is sized to fit in an opening in a plasma exposed surface of the side wall of the top chamber interface such that a distal end of the ceramic side gas injector projects 0.05 to 0.2 inch beyond the plasma exposed surface.

5. The gas injector of claim 1, wherein the first cylindrical section includes a first washer engaging surface on the first axial end surface.

6. The gas injector of claim 1, wherein the central bore has an aspect ratio of 13 to 14.

7. The gas injector of claim 1, wherein the ceramic side gas injector has a length of 0.52 to 0.53 inch, the first diameter of the first cylindrical section is 0.2 to 0.3 inch, and the second diameter of the second cylindrical section is 0.12 to 0.13 inch.

8. The gas injector of claim 1, wherein the first cylindrical section has a length of 0.27 to 0.28 inch, and the second cylindrical section has a length of 0.24 to 0.25 inch.

9. A top chamber interface of a plasma reaction chamber wherein a downstream section of a respective ceramic gas injector is mounted in each mounting hole in a side wall of the top chamber interface, each of the ceramic gas injectors consisting of:
　a first cylindrical section having:
　　a first diameter;
　　a first end; and
　　a first axial end surface; and
　a second cylindrical section having:
　　a second diameter that is less than the first diameter,
　　a second end where the second cylindrical section joins the first end of the first cylindrical section; and
　　a second axial end surface; and
　a uniform diameter central bore extending in an axial direction through the first and second axial end surfaces.

10. The top chamber interface of claim 9, wherein distal ends of each of the ceramic gas injectors projects beyond a plasma exposed surface of the side wall.

11. The top chamber interface of claim 9, wherein the first axial end surface includes a first washer engaging surface.

12. The top chamber interface of claim 9, wherein the central bore has an aspect ratio of 13 to 14.

13. The top chamber interface of claim 9, the each of the ceramic gas injectors has a length of 0.52 to 0.53 inch, the first diameter of the first cylindrical section is 0.2 to 0.3 inch, and the second diameter of the second cylindrical section is 0.12 to 0.13 inch.

14. The top chamber interface of claim 9, wherein the first cylindrical section has a length of 0.27 to 0.28 inch, and the second cylindrical section has a length of 0.24 to 0.25 inch.

15. The top chamber interface of claim 9, wherein the central bore has a diameter of 0.038 to 0.042 inch and length of 0.52 to 0.53 inch.

16. The top chamber interface of claim 9, wherein each of the ceramic gas injectors consists entirely of yttria.

17. The top chamber interface of claim 9, wherein the first diameter of the first cylindrical section is sized to fit in a wider portion of a mounting hole, and the second diameter of the second cylindrical section is sized to fit in an opening in a plasma exposed surface of the side wall of the top chamber interface such that distal ends of the ceramic gas injectors project 0.05 to 0.2 inch beyond the plasma exposed surface.

18. The top chamber interface of claim 9, wherein the side wall includes eight mounting holes with ceramic gas injectors mounted therein.

19. The top chamber interface of claim 9, wherein the top chamber interface is a monolithic metal cylinder having a uniform diameter inner surface, an upper flange extending horizontally away from the inner surface and a lower flange extending horizontally away from the inner surface; an upper annular vacuum sealing surface adapted to seal against a dielectric window of the plasma chamber; a lower annular vacuum sealing surface adapted to seal against a bottom section of the plasma chamber; a thermal mass at an upper portion of the cylinder, the thermal mass defined by a wider portion of the cylinder between the inner surface and an outer surface extending vertically from the upper flange, the thermal mass being effective to provide azimuthal temperature uniformity of the inner surface, and a thermal choke at a lower portion of the cylinder effective to minimize transfer of heat across the lower vacuum sealing surface, the thermal choke defined by a thin metal section having a thickness of less than 0.25 inch and extending at least 25% of the length of the inner surface.

20. The top chamber interface of claim 19, further including a gas delivery system comprising bifurcated gas lines and gas tubes arranged to flow a tuning gas equal distances from a common feed to the ceramic gas injectors mounted in a side wall of the top chamber interface.

* * * * *